United States Patent
Lee et al.

(10) Patent No.: US 10,026,490 B2
(45) Date of Patent: Jul. 17, 2018

(54) PROGRAMMING METHOD FOR REDUCING A WIDTH OF A THRESHOLD VOLTAGE DISTRIBUTION CURVE OF MEMORY CELLS

(71) Applicant: MACRONIX International Co., Ltd., Hsinchu (TW)

(72) Inventors: Ya-Jui Lee, Hsinchu (TW); Kuan-Fu Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 48 days.

(21) Appl. No.: 15/288,785

(22) Filed: Oct. 7, 2016

(65) Prior Publication Data
US 2018/0061503 A1    Mar. 1, 2018

(30) Foreign Application Priority Data
Aug. 31, 2016   (TW) .............................. 105128047 A

(51) Int. Cl.
*G11C 16/34*    (2006.01)
*G11C 16/26*    (2006.01)
*G11C 16/10*    (2006.01)
*G11C 16/04*    (2006.01)
*G11C 16/08*    (2006.01)
*G11C 16/12*    (2006.01)

(52) U.S. Cl.
CPC .......... *G11C 16/3459* (2013.01); *G11C 16/10* (2013.01); *G11C 16/26* (2013.01); *G11C 16/0483* (2013.01); *G11C 16/08* (2013.01); *G11C 16/12* (2013.01)

(58) Field of Classification Search
CPC . G11C 16/3459; G11C 16/0483; G11C 16/08; G11C 16/12; G11C 16/26
USPC ........................................ 365/185.17, 185.19
See application file for complete search history.

(56) References Cited

U.S. PATENT DOCUMENTS

| RE45,497 E | 4/2015 | Dutta et al. |
|---|---|---|
| 9,165,659 B1 * | 10/2015 | Pang ...................... G11C 16/10 |
| 2013/0094292 A1 | 4/2013 | Park et al. |
| 2013/0301351 A1 | 11/2013 | Dutta et al. |
| 2015/0070987 A1 | 3/2015 | Kim et al. |
| 2016/0240256 A1 * | 8/2016 | Lin .................... G11C 16/0483 |

OTHER PUBLICATIONS

"Office Action of Taiwan Counterpart Application", dated May 10, 2015, p. 1-p. 4.

* cited by examiner

*Primary Examiner* — Alexander Sofocleous
*Assistant Examiner* — Alfredo Bermudez Lozada
(74) *Attorney, Agent, or Firm* — J.C. Patents

(57) ABSTRACT

A memory device and a programming method thereof are provided, and the programming method of the memory device includes following steps. A memory cell grouping procedure is performed to divide a plurality of memory cells into a plurality of groups. After the memory cell grouping procedure is performed, a programming procedure is performed, and the programming procedure includes following steps. A first programming pulse, a second programming pulse and a verification pulse are provided to a word line. A first group is programmed by the first programming pulse, and a second group is programmed by the second programming pulse. Whether the first group and the second group respectively pass a verification operation is determined by the verification pulse.

18 Claims, 8 Drawing Sheets

PROGRAMMING METHOD FOR REDUCING A WIDTH OF A THRESHOLD VOLTAGE DISTRIBUTION CURVE OF MEMORY CELLS

CROSS-REFERENCE TO RELATED APPLICATION

This application claims the priority benefit of Taiwan application serial no. 105128047, filed on Aug. 31, 2016. The entirety of the above-mentioned patent application is hereby incorporated by reference herein and made a part of this specification.

BACKGROUND OF THE INVENTION

Field of the Invention

The invention relates to a device and an operating method thereof and more particularly, to a memory device and a programming method thereof.

Description of Related Art

A flash memory commonly uses a memory array in an NAND or an NOR structure. The NAND memory array is suitable for being applied to high-density data storage and therefore, becomes widely spread. Generally speaking, the NAND memory array is programmed by using an incremental step pulse program method, in which a single programming pulse and a single verification pulse are used for a programming operation and a verification operation during each cycle.

For example, FIG. 1 is a schematic diagram illustrating a threshold voltage distribution curve of memory cells in a conventional programming method. Referring to FIG. 1, during a first cycle, a threshold voltage distribution of memory cells is presented as a curve 111 in response to a single programming pulse. In addition, during the next cycle, the single programming pulse is applied again, so as to perform the programming operation on the memory cells which does not pass the verification operation, and the threshold voltage distribution of the memory cells after the operation has been performed for two cycles is illustrated as a curve 112. To deduce by analogy, the single programming pulse is repeatedly applied to the memory cells which do not pass the verification operation during each cycle in the conventional programming method. In this way, after the programming operation is performed for several times during the cycles, the threshold voltage distribution of the memory cells is illustrated as a curve 120, i.e., the threshold voltage of each memory cell is greater than or equal to a verification voltage VF1, such that each memory cell is programmed to a target state.

However, as for the conventional programming method, a width of the threshold voltage distribution curve is usually too wide during each cycle, which causes increase in cycle times of the program operation. In addition, as the cycle times of the program operation increase, a verification time of the memory array significantly increases, which leads to reduction of the programming speed of the memory array. Furthermore, referring to FIG. 1, as for the memory cell 132 which passes the verification operation, the influence caused by the memory cell 131 which does not pass the verification is proportional to the width (i.e., a voltage difference $\Delta V1$) of the threshold voltage distribution curve. Thus, in case the width of the threshold voltage distribution curve is too wide, a bit-line interference effect becomes worse, which leads to reduction of programming quality of the memory array.

SUMMARY OF THE INVENTION

The invention provides a memory device and a programming method thereof, capable of reducing a width of a threshold voltage distribution curve for memory cells, so as to increase a programming speed of a memory array, reduce the time consumed in a verification operation and prevent the occurrence of the bit-line interference effect.

According to an embodiment of the invention, a programming method of a memory device is provided. A memory array of the memory device includes a plurality of memory cells electrically connected to a word line. The programming method includes the following steps. A memory cell grouping procedure is performed to divide the memory cells into a plurality of groups, and the groups include a first group and a second group. A programming procedure is performed after the memory cell grouping procedure is performed, and the programming procedure includes following steps. A first programming pulse, a second programming pulse and a verification pulse are provided to the word line. A first group is programmed by the first programming pulse, and a second group is programmed by the second programming pulse. Whether the first group and the second group respectively pass a verification operation is determined by the verification pulse.

According to an embodiment of the invention, a memory device including a memory array and a memory controller is provided. The memory array includes a plurality of memory cells, and the memory cells are electrically connected to a word line. The memory controller performs a memory cell grouping procedure to divide the memory cells into a plurality of groups. After the memory cell grouping procedure is performed, the memory controller performs the programming procedure. In the programming procedure, the memory controller provides a first programming pulse, a second programming pulse and a verification pulse to the word line, the memory controller programs a first group by the first programming pulse, and programs a second group by the second programming pulse. In addition, in the programming procedure, the memory controller determines whether the first group and the second group respectively pass a verification operation by the verification pulse, so as to determine whether to continuously repeat the programming procedure.

To sum up, in the invention, the memory cells is divided into the groups by performing the memory cell grouping procedure, and different programming pulses are provided for different groups in the programming procedure. In this way, the width of the threshold voltage distribution curve of the memory cells can be effectively reduced, such that cycle times of the programming operation can be reduced. Thereby, the programming speed of the memory array can be increased by reducing times of the verification operation, and prevent the occurrence of the bit-line interference effect.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Figure 1:
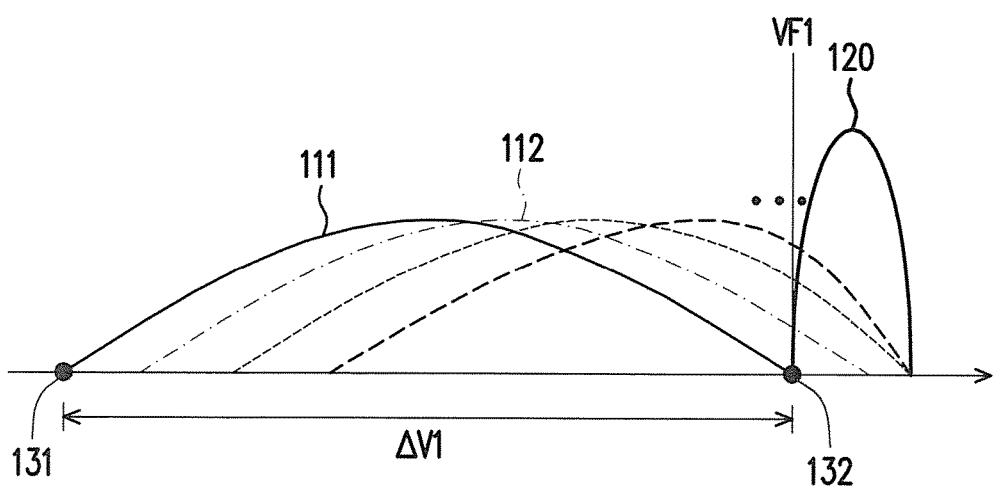
FIG. 1 is a schematic diagram illustrating a threshold voltage distribution curve of memory cells in a conventional programming method.
Figure 2:
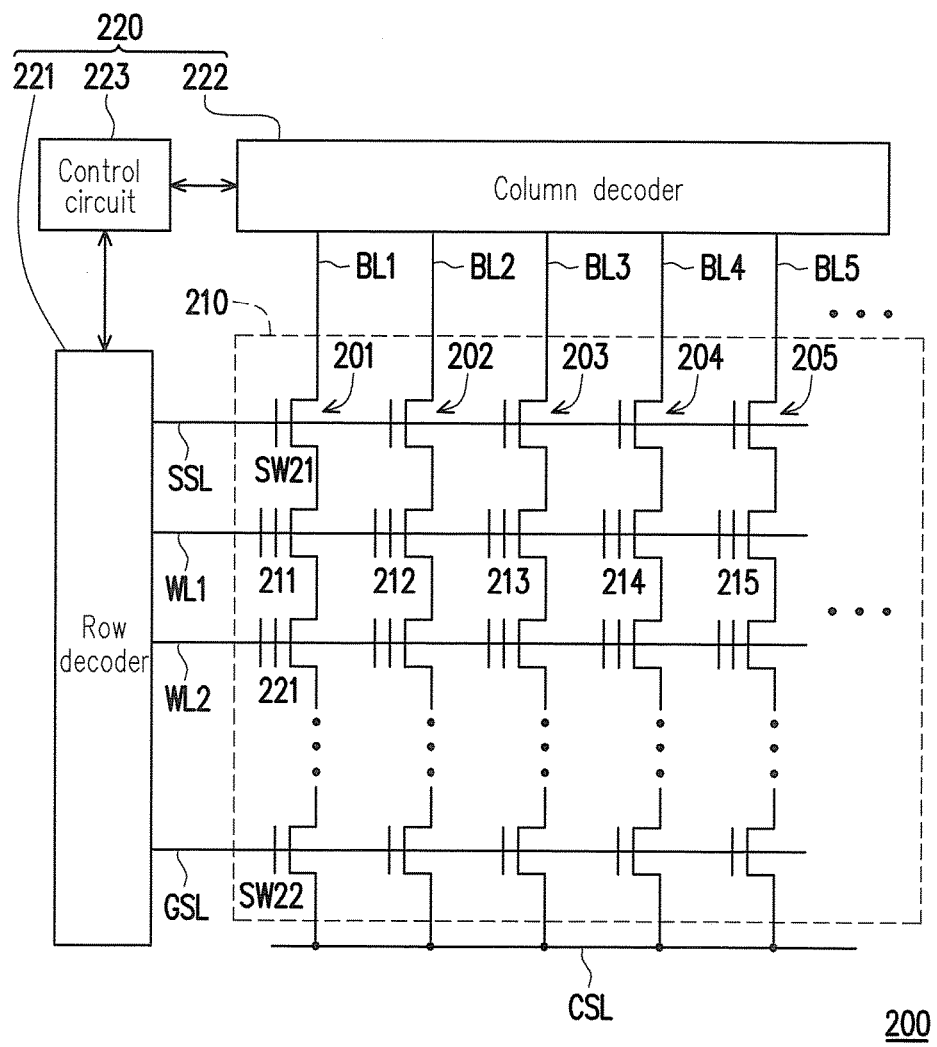
FIG. 2 is a schematic diagram of a memory device according to an embodiment of the invention.

FIG. 2 is a schematic diagram of a memory device according to an embodiment of the invention. Referring to FIG. 2, a memory device 200 includes a memory array 210 and a memory controller 220, and the memory controller 220 includes a row decoder 221, a column decoder 222 and a control circuit 223. The memory array 210 is, for example, an NAND memory array. In addition, the memory array 210 includes a plurality of memory cell strings. Each memory cell string is electrically connected to a common source line CSL and includes a first transistor, a plurality of memory cells and a second transistor.

For example, a memory cell string 201 includes a first transistor SW21, memory cells 211 and 221 and a second transistor SW22 connected in series. The column decoder 222 is electrically connected to the memory array 210 through bit lines BL1 to BL5. The row decoder 221 is electrically connected to the first transistor (e.g., the first transistor SW21) in each memory cell string through a string selection line SSL, electrically connected to the second transistor (e.g., the second transistor SW22) in each memory cell string through a ground selection line GSL, and electrically connected to the memory cells (e.g., the memory cells 211 and 221) in each memory cell string through word lines WL1 to WL2.

In operation, the row decoder 221 and the column decoder 222 select memory cells from the memory array 210 according to an address signal from the control circuit 223, so as to perform a programming procedure, a reading procedure or an erasing procedure on the selected memory cells. For instance, the memory controller 220 repeatedly performs the programming procedure to program the memory cells to a target state. It is to be mentioned that before repeatedly performing the programming procedure, the memory controller 220 performs a memory cell grouping procedure to divide the memory cells into a plurality of groups. In addition, in each programming procedure, the memory controller 220 provides different programming pulses for the memory cells of different groups. Thereby, a width of a threshold voltage distribution curve of the memory cells may be effectively reduced, which contributes to increasing a programming speed of the memory array 210 and preventing a bit-line interference effect.

Figure 3:
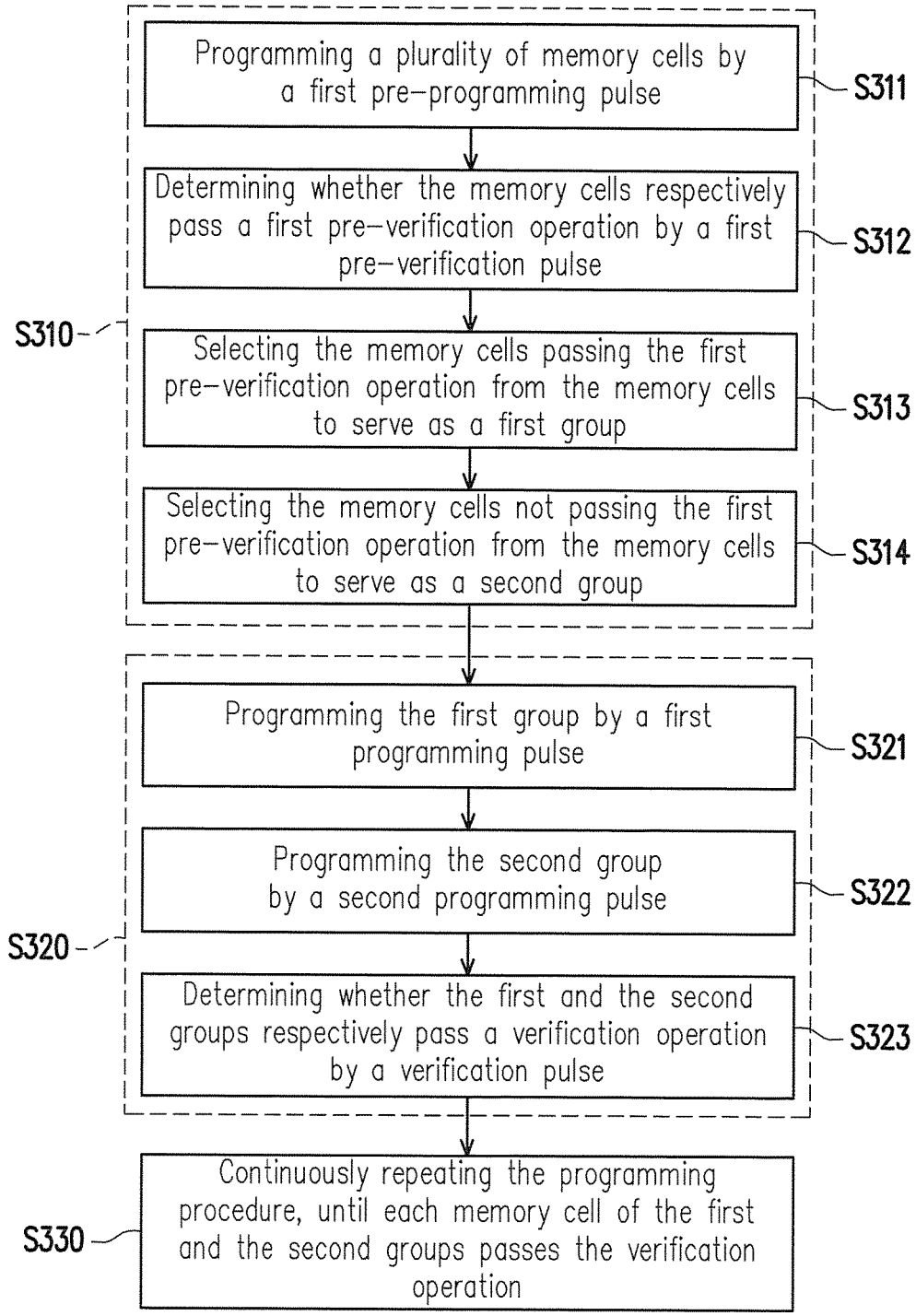
FIG. 3 is a flowchart of a programming method of a memory device according to an embodiment of the invention.
Figure 4:
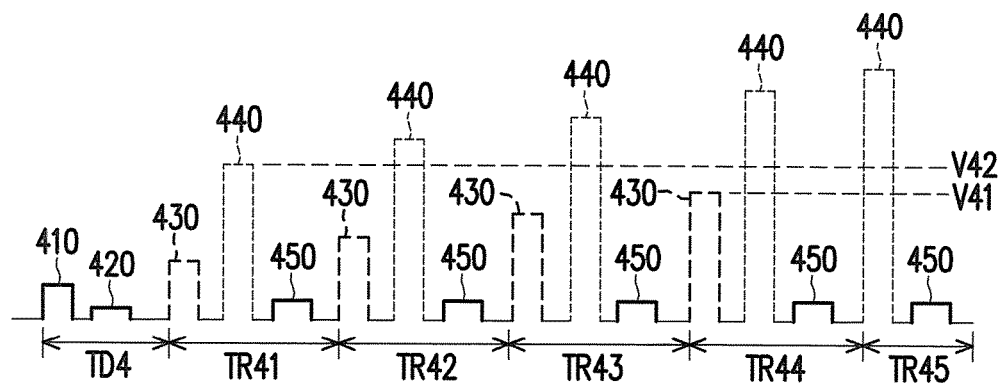
FIG. 4 is a schematic waveform diagram illustrating the programming operation according to an embodiment of the invention.

For people having ordinary skill in the art to better understand the invention, FIG. 3 is a flowchart of a programming method of a memory device according to an embodiment of the invention, FIG. 4 is a schematic waveform diagram illustrating the programming operation according to an embodiment of the invention, and an operating method of programming the memory device 200 will be illustrated with reference to FIG. 2 to FIG. 4 hereinafter.

In an embodiment, a target state of the memory cell 211 is, for example, logic 1, and a target state of the memory cells 212 to 215 is, for example, logic 0. In addition, referring to step S310, the memory controller 220 performs the memory cell grouping procedure on the memory cells 212 to 215 corresponding to the target state of logic 0, so as to divide the memory cells 212 to 215 into a first group and a second group. For example, referring to steps S311 and S312, during a grouping period TD4, the row decoder 221 sequentially provides a first pre-programming pulse 410 and a first pre-verification pulse 420 to the word line WL1. Thereby, the memory controller 220 programs the memory cells 212 to 215 by the first pre-programming pulse 410, and determines whether the memory cells 212 to 215 respectively pass a first pre-verification operation by the first pre-verification pulse 420.

Specifically, during the process of programming the memory cells 212 to 215, the row decoder 221 provides a pass voltage to the word lines except for the word line WL1. The column decoder 222 sets the memory cell strings 202 to 205 to a selected state, and sets the memory cell string 201 to a inhibit state. In addition, the first transistors in the memory cell strings 202 to 205 are switched to a turn-on state in response to a signal from the string selection line SSL, the second transistors in the memory cell strings 202 to 205 are switched to a turn-off state in response to a signal from the ground selection line GSL. Thereby, the first pre-programming pulse 410 induces electrons to be injected from a semiconductor body of the memory array 210 to floating gates of the memory cells 212 to 215, so as to program the memory cells 212 to 215.

During the process of verifying the memory cells 212 to 215, the row decoder 221 provides the pass voltage to the word lines except for the word line WL1, and provides a high voltage to the string selection line SSL and the ground selection line GSL. In addition, the column decoder 222 reads signals from the bit lines BL2 to BL5 to determine whether the memory cells 212 to 215 pass a first pre-verification operation. For example, the column decoder 222 may determine whether a threshold voltage of the memory cell 212 is not less than a first pre-verification voltage according to a voltage level of the bit line BL2. When the threshold voltage of the memory cell 212 is not less than the first pre-verification voltage, the row decoder 221 determines that the memory cell 212 passes the first pre-verification operation. On the other hand, when the threshold voltage of the memory cell 212 is less than the first pre-verification voltage, the row decoder 221 determines that the memory cell 212 does not pass the first pre-verification operation.

Referring to steps S313 and S314, in response to the result of the first pre-verification operation, the column decoder 222 selects the memory cells passing the first pre-verification operation (e.g., the memory cells 212 and 214) from the memory cells 212 to 215 to serve as the first group, and selects the memory cells not passing the first pre-verification operation (e.g., the memory cells 213 and 215) from the memory cells 212 to 215 to serve as the second group. In other words, according to the result of the first pre-verification operation, the memory cells 212 and 214 have a faster programming speed, and thus, the column decoder 222 sets the memory cells 212 and 214 as the first group. On the other hand, the memory cells 213 and 215 have a slower programming speed, and thus, the column decoder 222 sets the memory cells 213 and 215 as the second group. In addition, the column decoder 222 stores the grouping result of the memory cells 212 to 215 in a memory of any type, for example, a cache memory, a static random access memory (SRAM), or the like.

Referring to step S320, after performing the memory cell grouping procedure, the memory controller 220 performs a programming procedure. For example, in term of the detailed process of step S320, referring to steps S321 to S323, during a cycle TR41, the control circuit 223 controls the row decoder 221 in response to the grouping result of the memory cells 212 to 215, such that the row decoder 221 sequentially provides a first programming pulse 430, a second programming pulse 440 and a verification pulse 450 to the word line WL1. In addition, the memory controller 220 programs the memory cells 212 and 214 by the first programming pulse 430, and programs the memory cells 213 and 215 by the second programming pulse 440. Furthermore, the memory controller 220 determines whether the memory cells 212 to 215 of the first group and the second group respectively pass a verification operation by the verification pulse 450.

Specifically, the first programming pulse 430 is less than the second programming pulse 440 within the cycle TR41. In addition, during the process of programming the first group (i.e., the memory cells 212 and 214), the column decoder 222 sets the memory cell strings 202 and 204 to the selected state, and sets the memory cell strings 201, 203 and 205 to the inhibit state. In addition, the memory controller 220 uses the first programming pulse 430 having a lower level to perform the programming operation on the first group having the faster programming speed. On the other hand, during the process of programming the second group (i.e., the memory cells 213 and 215), the column decoder 222 sets the memory cell strings 203 to 205 to the selected state, and sets the memory cell strings 201, 202 and 204 to the inhibit state. In addition, the memory controller 220 uses the second programming pulse 440 having a higher level to perform the programming operation on the second group having the slower programming speed.

Furthermore, the memory controller 220 determines whether to perform the programming and the verification operations on the first group again according to the verification result of the first group. For example, during the cycle TR41, both the memory cells 212 and 214 of the first group do not pass the verification operation. Thus, during the next cycle TR42, the memory controller 220 again provides the first programming pulse 430. In addition, the memory controller 220 increases a level of the first programming pulse 430 by a predetermined amount, and uses the increased first programming pulse 430 to again program the memory cells of the first group which do not pass the verification operation. To deduce by analogy, the memory controller 220 continuously uses the first programming pulse 430 and the verification pulse 450 to repeatedly perform the programming and the verification operations on the first group during the cycles TR41 through TR44, so as to program both the memory cells 212 and 214 of the first group to the target state.

Similarly, the memory controller 220 determines whether to perform the programming and the verification operations on the second group again according to the verification result of the second group. For example, during the cycle TR41, both the memory cells 213 and 215 of the second group do not pass the verification operation. Thus, during the next cycle TR42, the memory controller 220 again provides the second programming pulse 440, and increases a level of the second programming pulse 440 by a predetermined amount, so as to use the increased second programming pulse 440 to again program the memory cells of the second group which do not pass the verification operation. To deduce by analogy, the memory controller 220 continuously uses the second programming pulse 440 and the verification pulse 450 to repeatedly perform the programming and the verification operations on the second group during the cycles TR41 through TR45, so as to program the both memory cells 213 and 215 of the second group to the target state.

In other words, referring to step S330, the memory controller 220 continuously repeats the programming procedure, until each memory cell of the first and the second groups passes the verification operation. In addition, during the repeated programming procedure, the memory controller 220 increases the levels of the first programming pulse 430 and the second programming pulse 440. Thereby, referring to FIG. 4, during the cycles TR41 through TR45, the memory controller 220 uses the first programming pulse 430 gradually rising to a first voltage V41 to program each memory cell of the first group to the target state, and uses the second programming pulse 440 gradually rising from a second voltage V42 to program each memory cell of the second group to the target state.

Furthermore, the first programming pulse 430 within the cycle TR41 is greater than the first pre-programming pulse 410 by a predetermined amount. In addition, during each of the cycles TR41 through TR45, the level of the first programming pulse 430 is increased by a predetermined amount. On the other hand, the second programming pulse 440 during the cycle TR41 is greater than the first programming pulse 430 during the cycle TR44 by a predetermined amount. In addition, during each of the cycles TR41 through TR45, the level of the second programming pulse 440 is also increased by a predetermined amount. Furthermore, a level of the first pre-verification pulse 420 is maintained at the first pre-verification voltage. During the cycles TR41 through TR45, a level of the verification pulse 450 is maintained at the verification voltage, and the verification voltage is greater than the first pre-verification voltage.

Figure 5:
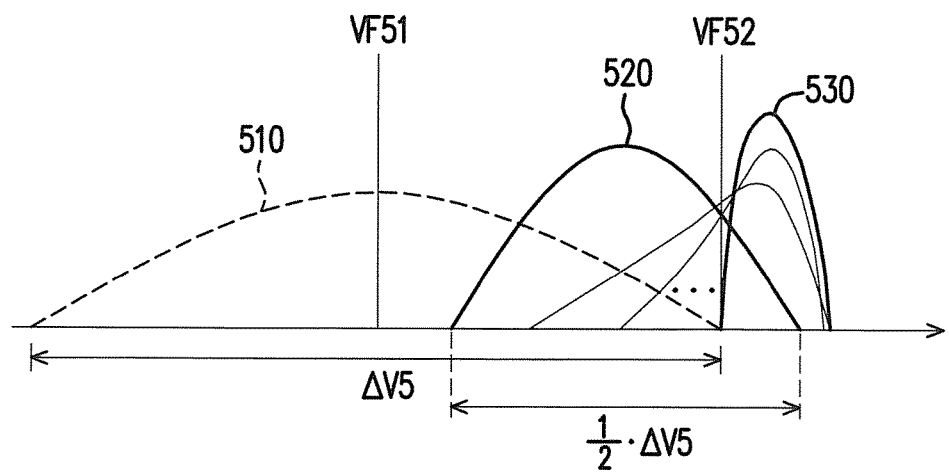
FIG. 5 is a schematic diagram illustrating threshold voltage distribution curves according to an embodiment of the invention.

It should be noted that the memory controller 220 is capable of providing different programming pulses for different groups, and thereby, reducing a width of a threshold voltage distribution curve of the memory cells. For example, FIG. 5 is a schematic diagram illustrating threshold voltage distribution curves according to an embodiment of the invention. Referring to FIG. 5, after being programmed by the first pre-programming pulse 410, a threshold voltage distribution of the memory cells is illustrated as a curve 510.

In addition, according to the result of the first pre-verification operation, the memory cells having threshold voltages not less than a first pre-verification voltage VF51 are grouped into the first group, and the memory cells having threshold voltages less than the first pre-verification voltage VF51 are grouped into the second group.

After being programmed during the first cycle TR41, the threshold voltage distribution of the memory cells is illustrated as a curve 520. In addition, after the programming operation is performed for several times during the cycles, the threshold voltage distribution of the memory cells is illustrated as a curve 530, the threshold voltage of each memory cell is not less than the verification voltage VF52. It should be noted that in comparison with a width (i.e., a voltage difference ΔV5) of the threshold voltage distribution curve 510, a width of the threshold voltage distribution curve 520 is about half the width of the threshold voltage distribution curve 510, i.e., ½×ΔV5. In other words, through the programming pulses provided to different groups, the width of the threshold voltage distribution curve of the memory cells may be significantly reduced. In addition, as the width of the threshold voltage distribution curve is reduced, cycle times of the programming operation may be reduced. In this way, the verification time of the memory array 210 may be reduced, which contributes to increasing the programming speed of the memory array 210. In addition, as the width of the threshold voltage distribution curve is reduced, the occurrence of the bit-line interference effect may be prevented.

In the embodiment illustrated in FIG. 3, for example, the memory cells are grouped into two groups, and two different programming pulses are provided for the two groups, but the invention is not limited thereto. In another embodiment, the memory controller 220 may also group a plurality of memory cells into N groups by the memory cell grouping procedure, and provide N different programming pulses for the N groups, wherein N is an integer larger than 2.

Figure 6:
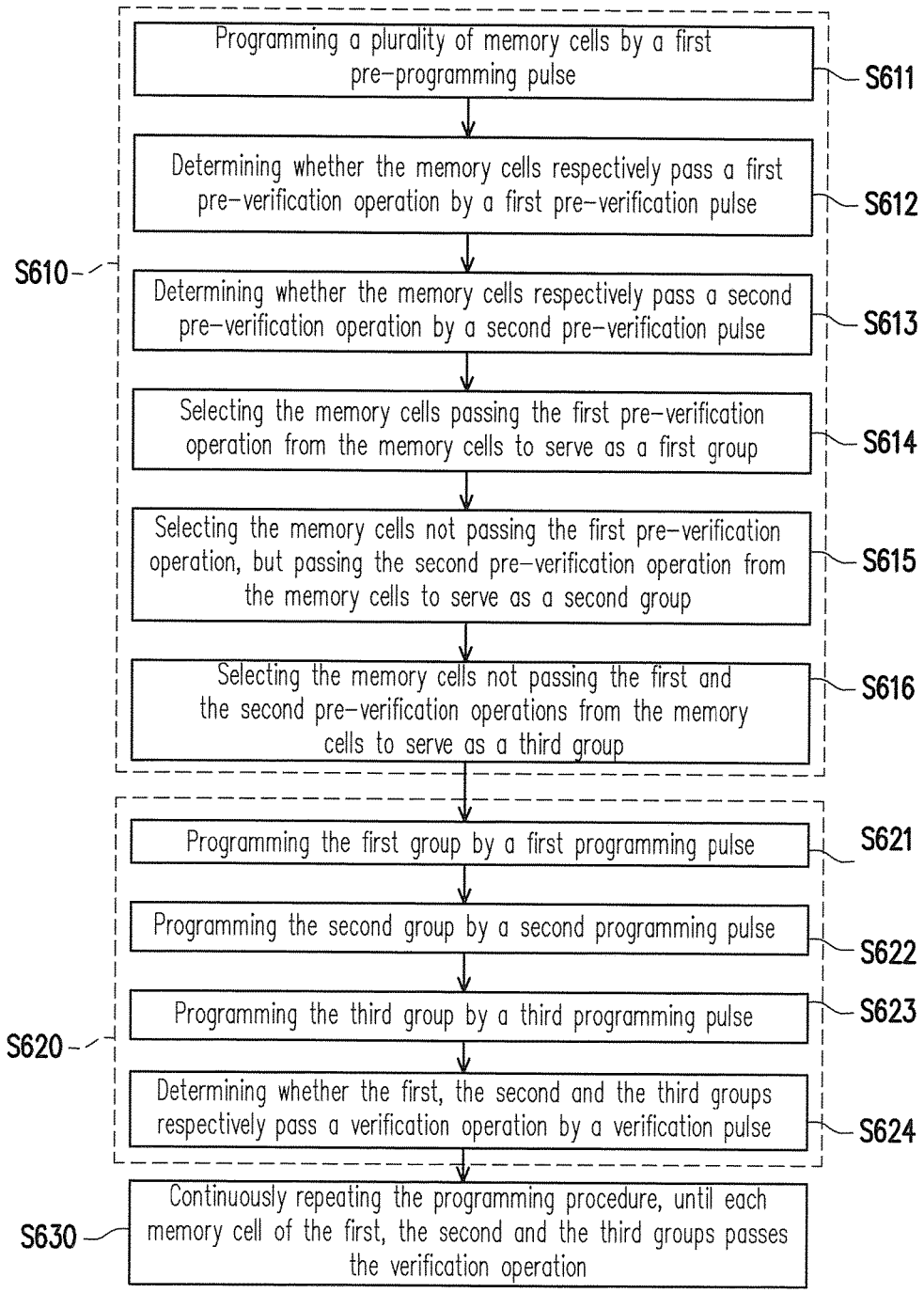
FIG. 6 is a flowchart of a programming method of a memory device according to another embodiment of the invention.
Figure 7:
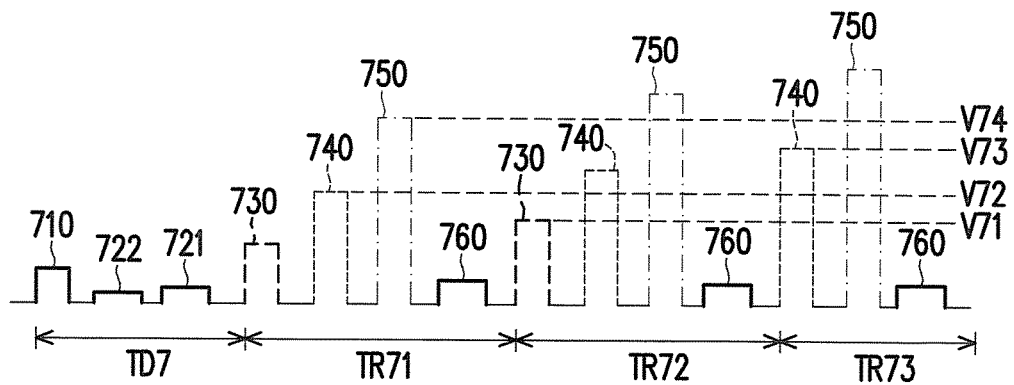
FIG. 7 is a schematic waveform diagram illustrating the programming operation according to another embodiment of the invention.
Figure 8:
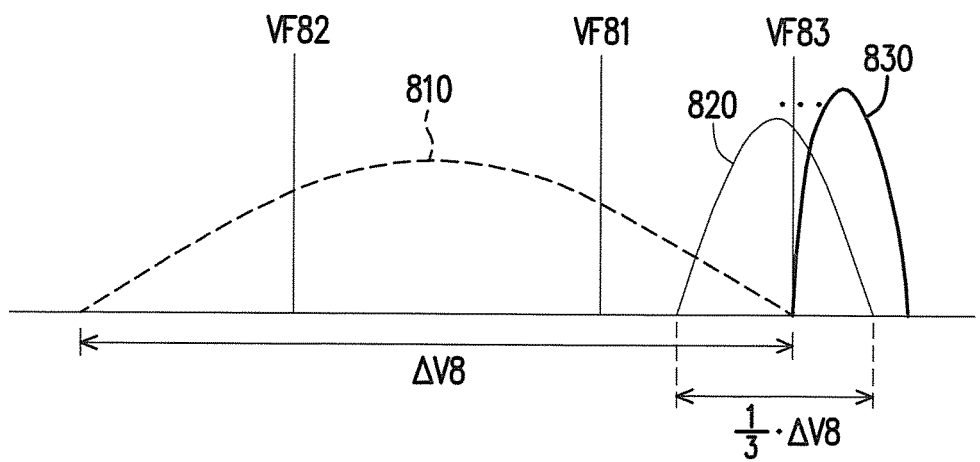
FIG. 8 is a schematic diagram illustrating threshold voltage distribution curves according to another embodiment of the invention.

For example, FIG. 6 is a flowchart of a programming method of a memory device according to another embodiment of the invention, FIG. 7 is a schematic waveform diagram illustrating the programming operation according to another embodiment of the invention, FIG. 8 is a schematic diagram of threshold voltage distribution curves according to another embodiment of the invention, and an operating method of programming the memory device 200 illustrated in FIG. 2 will be described again with reference to FIG. 6 to FIG. 8 hereinafter.

Referring to step S610, the memory controller 220 performs the memory cell grouping procedure to divide the memory cells 212 to 215, which are corresponding to the target state of logic 0, into a first group, a second group and a third group. In term of the detailed process of step S610, during a grouping period TD7, the row decoder 221 sequentially provides a first pre-programming pulse 710, a second pre-verification pulse 722 and a first pre-verification pulse 721 to the word line WL1. Referring to step S611, the memory controller 220 programs the memory cells 212 to 215 by the first pre-programming pulse 710. In addition, referring to FIG. 8, after being programmed by the first pre-programming pulse 710, a threshold voltage distribution of the memory cells is illustrated as a curve 810.

Referring to steps S612 and S613, the memory controller 220 determines whether the memory cells 212 to 215 respectively pass a first pre-verification operation by the first pre-verification pulse 721, and determines whether the memory cells 212 to 215 respectively pass a second pre-verification operation by the second pre-verification pulse 722. A level of the first pre-verification pulse 721 is maintained at a first pre-verification voltage VF81, a level of the second pre-verification pulse 722 is maintained at a second pre-verification voltage VF82, and the first pre-verification voltage VF81 is greater than the second pre-verification voltage VF82.

Referring to step S614, the column decoder 222, in response to results of the first pre-verification operation and the second pre-verification operation, selects the memory cells passing the first pre-verification operation (e.g., the memory cells 212 and 214) from the memory cells 212 to 215 to serve as the first group. Referring to step S615, the column decoder 222 further selects the memory cells not passing the first pre-verification operation, but passing the second pre-verification operation (e.g., the memory cell 213) from the memory cells 212 to 215 to serve as the second group. Referring to step S616, the column decoder 222 further selects the memory cells not passing the first pre-verification operation and the second pre-verification operation (e.g., the memory cell 215) from the memory cells 212 to 215 to serve as the third group.

In other words, referring to FIG. 8, the memory cells having the threshold voltages greater than the first pre-verification voltage VF81, i.e., the memory cells having a faster programming speed, are grouped into the first group. The memory cells having the threshold voltages ranging between the first pre-verification voltage VF81 and the second pre-verification voltage VF82, i.e., the memory cells having an intermediate programming speed, are grouped into the second group. Furthermore, the memory cells having the threshold voltages less than the second pre-verification voltage VF82, i.e., the memory cells having a slower programming speed, are grouped into the third group.

Referring to step S620, after performing the memory cell grouping procedure, the memory controller 220 performs a programming procedure to program and verify the memory cells. For example, in term of the detailed process of step S620, during a cycle TR71, the memory controller 220 sequentially provides a first programming pulse 730, a second programming pulse 740, a third programming pulse 750 and a verification pulse 760 to the word line WL1. In addition, within the cycle TR71, the first programming pulse 730 is less than the second programming pulse 740, and the second programming pulse 740 is less than the third programming pulse 750.

Specifically, referring to step S621, the memory controller 220 programs the first group (i.e., the memory cells 212 and 214) in the selected state by the first programming pulse 730, and the memory cell strings 201, 203 and 205 in this circumstance are set to the inhibit state. In addition, referring to step S622, the memory controller 220 programs the second group (i.e., the memory cell 213) in the selected state by the second programming pulse 740, and the memory cell strings 201, 202, 204 and 205 in this circumstance are set to the inhibit state. Furthermore, referring to step S623, the memory controller 220 programs the third group (i.e., the memory cell 215) in the selected state by the third programming pulse 750, and the memory cell strings 201 to 204 in this circumstance are set to the inhibit state. In addition, referring to FIG. 8, after being programmed during the cycle TR71, the memory cells have a threshold voltage distribution curve as presented by a curve 820.

Referring to step S623, during the cycle TR71, the memory controller 220 determines whether the memory cells 212 to 215 of the first through the third groups respectively pass the verification operation by the verification pulse 760. If each of the memory cells 212 to 215 does not pass the verification operation, the memory controller 220 again provides the first programming pulse 730 through the third programming pulses 750 during the next cycle TR72. In addition, during the cycle TR72, the memory controller 220 increases a level of each of the first programming pulse 730 through the third programming pulse 750 by a predetermined amount, and uses the increased first programming pulse 730 through third programming pulse 750 to program the memory cells 212 to 215 in the first through the third groups.

When the programming operation is completely performed on the memory cells 212 to 215, the memory controller 220 determines whether the memory cells 212 to 215 respectively pass the verification operation by the verification pulse 760. If the second group and the third group do not pass the verification operation, but the first group (i.e., the memory cells 212 and 214) passes the verification operation, the memory controller 220 uses the increased second programming pulse 740 to program the second group (i.e., the memory cell 213) during the next cycle TR73, and uses the increased third programming pulse 750 to program the third group (i.e., the memory cell 215). Thereby, through the programming operation during the cycles TR71 to TR73, the memory cells have a threshold voltage distribution curve as presented by a curve 830 in FIG. 8, i.e., the threshold voltages of all the memory cells of the first through the third groups are not less than a verification voltage VF83, such that each of the first through the third groups is programmed to the target state.

In other words, referring to step S630, the memory controller 220 continuously repeats the programming procedure, until each memory cell of the first through the third groups passes the verification operation. In addition, during the repeated programming procedure, the memory controller 220 increases the level of each of the first programming pulse 730 to the third programming pulse 750. Thereby, referring to FIG. 7, during the cycles TR71 to TR73, the memory controller 220 uses the first programming pulse 730 gradually rising to a first voltage V71 to program the first group to the target state, uses the second programming pulse 740 gradually rising from a second voltage V72 to a third voltage V73 to program the second group to the target state, and uses the third programming pulse 750 gradually rising from a fourth voltage V74 to program the third group to the target state.

It is to be mentioned that referring to FIG. 8, in comparison with a width (i.e., a voltage difference ΔV8) of the threshold voltage distribution curve 810, a width of the threshold voltage distribution curve 820 is about one third of the width of the threshold voltage distribution curve 810, i.e., ⅓×ΔV8. In other words, through the programming pulses provided to different groups, the width of the threshold voltage distribution curve of the memory cells may be significantly reduced. In this way, the verification time of the memory array 210 may be reduced, which contributes to increasing the programming speed of the memory array 210. In addition, as the width of the threshold voltage distribution curve is reduced, the occurrence of the bit-line interference effect may be prevented.

Figure 9:
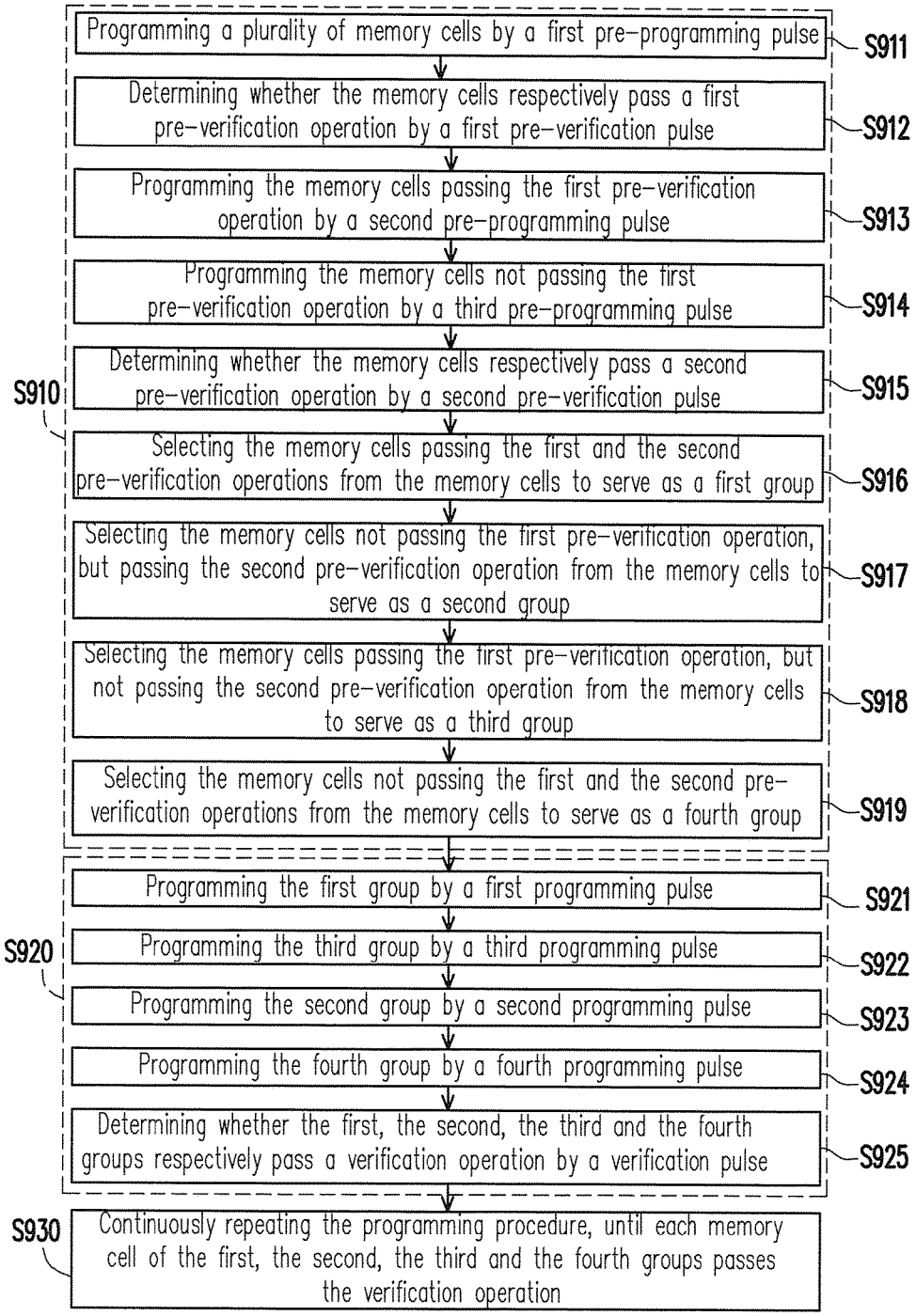
FIG. 9 is a flowchart of a programming method of a memory device according to yet another embodiment of the invention.
Figure 10:
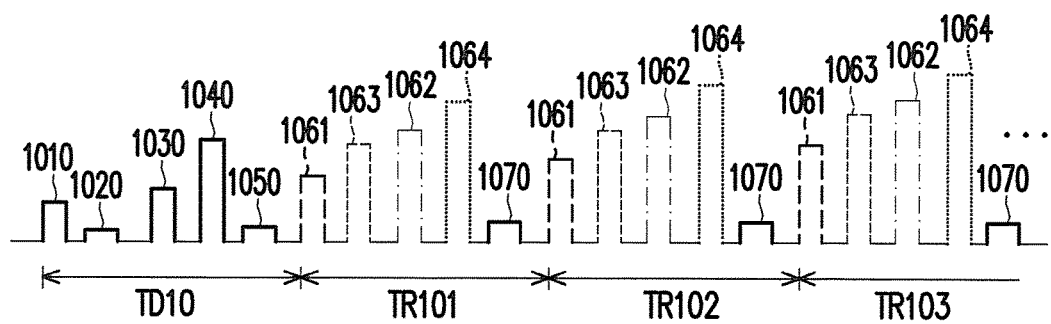
FIG. 10 is a schematic waveform diagram illustrating the programming operation according to yet another embodiment of the invention.

FIG. 9 is a flowchart of a programming method of a memory device according to yet another embodiment of the invention, FIG. 10 is a schematic waveform diagram illustrating the programming operation according to yet another embodiment of the invention, FIG. 11 is a schematic diagram illustrating threshold voltage distribution curves according to yet another embodiment of the invention, and an operating method of programming the memory device 200 will be described again with reference to FIG. 9 to FIG. 11 hereinafter.

Referring to step S910, the memory controller 220 performs the memory cell grouping procedure to divide the memory cells 212 to 215, which are corresponding to the target state of logic 0, into a first through a fourth groups. In term of the detailed process of step S910, during a grouping period TD10, the memory controller 221 sequentially provides a first pre-programming pulse 1010, a first pre-verification pulse 1020, a second pre-programming pulse 1030, a third pre-programming pulse 1040 and a second pre-verification pulse 1050 to the word line WL1. The third pre-programming pulse 1040 is greater than the second pre-programming pulse 1030, and the second pre-programming pulse 1030 is greater than the first pre-programming pulse 1010.

Referring to steps S911 and S912, the memory controller 220 programs the memory cells 212 to 215 by the first pre-programming pulse 1010, and determines whether the memory cells 212 to 215 respectively pass the first pre-verification operation by the first pre-verification pulse 1020. In addition, referring to FIG. 11, after being programmed by the first pre-programming pulse 1010, a threshold voltage distribution of the memory cells is presented in a curve 1110. In addition, in response to the result of the first pre-verification operation, the memory controller 220 selects the memory cells 212 and 214 having the threshold voltages not less than a first pre-verification voltage VF111, and selects the memory cells 213 and 215 having the threshold voltages less than the first pre-verification voltage VF111.

Referring to steps S913 and S914, the memory controller 220 programs the memory cells 212 and 214 passing the first pre-verification operation by the second pre-programming pulse 1030, and programs the memory cells 213 and 215 not passing the first pre-verification operation by the third pre-programming pulse 1040. In addition, after being programmed by the second and the third pre-programming pulses 1030 and 1040, the threshold voltage distribution of the memory cells is presented as a curve 1120 in FIG. 11. Furthermore, referring to step S915, the memory controller 220 determines whether the memory cells 212 to 215 respectively pass the second pre-verification operation by the second pre-verification pulse 1050. A level of the second pre-verification pulse 1050 (i.e., a second pre-verification voltage VF112) is greater than a level of the first pre-programming pulse 1010 (i.e., the first pre-verification voltage VF111).

Referring to step S916, the memory controller 220 selects the memory cell 212 passing the first and the second pre-verification operations from the memory cells 212 to 215 to serve as the first group. Referring to step S917, the memory controller 220 selects the memory cell 213 not passing the first pre-verification operation, but passing the second pre-verification operation from the memory cells 212 to 215 to serve as the second group. Referring to step S918, the memory controller 220 selects the memory cell 214 passing the first pre-verification operation, but not passing the second pre-verification operation from the memory cells 212 to 215 to serve as the third group.

Referring to step S919, the memory controller 220 selects the memory cell 215 not passing the first and the second pre-verification operations from the memory cells 212 to 215 to serve as the fourth group. In other words, a programming speed of the first group (i.e., the memory cell 212) is greater than a programming speed of the third group (i.e., the memory cell 214), the programming speed of the third group (i.e., the memory cell 214) is greater than a programming speed of the second group (i.e., the memory cell 213), and the programming speed of the second group (i.e., the memory cell 213) is greater than a programming speed of the fourth group (i.e., the memory cell 215).

Referring to step S920, after performing the memory cell grouping procedure, the memory controller 220 performs the programming procedure to program and verify the memory cells. For example, in term of the detailed process of step S920, during a cycle TR101, the memory controller 220 sequentially provides a first programming pulse 1061, a third programming pulse 1063, a second programming pulse 1062, a fourth programming pulse 1064 and a verification pulse 1070 to the word line WL1. The third programming pulse 1063 is greater than the first programming pulse 1061 and less than the second programming pulse 1062, and the fourth programming pulse 1064 is greater than the second programming pulse 1062.

Specifically, referring to step S921, the memory controller 220 programs the first group (i.e., the memory cell 212) in the selected state by the first programming pulse 1061, and the memory cell strings 201 and 203 to 205 in this circumstance are set to the inhibit state. Referring to step S922, the memory controller 220 programs the third group (i.e., the memory cell 214) in the selected state by the third programming pulse 1063, and the memory cell strings 201 to 203 and 205 in this circumstance are set to the inhibit state. Referring to step S923, the memory controller 220 programs the second group (i.e., the memory cell 213) in the selected state by the second programming pulse 1062, and the memory cell strings 201, 202, 204 and 205 in this circumstance are set to the inhibit state. Referring to step S924, the memory controller 220 programs the fourth group (i.e., the memory cell 215) in the selected state by the fourth programming pulse 1064, and the memory cell strings 201 to 204 in this circumstance are set to the inhibit state.

Referring to step S924, during the cycle TR101, the memory controller 220 determines whether the memory cells 212 to 215 of the first through the fourth groups respectively pass the verification operation by the verification pulse 1070. If each of the memory cells 212 to 215 does not pass the verification operation, the memory controller 220 again provides the first programming pulse 1061 through the fourth programming pulses 1064 during the next cycle TR102. In addition, during the cycle TR102, the memory controller 220 increases a level of each of the first programming pulse 1061 to the fourth programming pulse 1064 for a predetermined amount, and uses the increased first programming pulse 1061 through fourth programming pulse 1064 to again program the memory cells 212 to 215 of the first through the fourth groups.

Similarly, during a cycle TR103, the memory controller 220 again uses the increased first programming pulse 1061 through fourth programming pulse 1064 to program the memory cells 212 to 215 of the first through the fourth groups. In other words, referring to step S930, the memory controller 220 continuously repeats the programming procedure, until each memory cell of the first, the second, the third and the fourth groups passes the verification operation.

Figure 11:
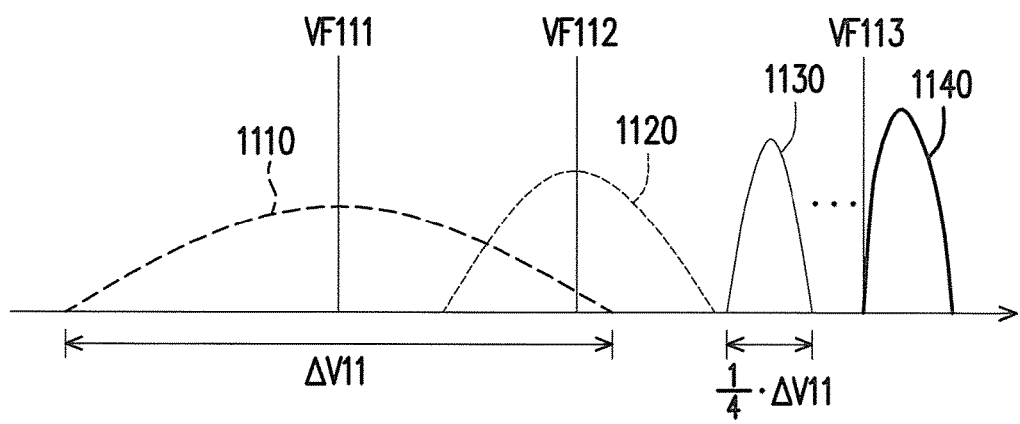
FIG. 11 is a schematic diagram illustrating threshold voltage distribution curves according to yet another embodiment of the invention.

It is to be mentioned that referring to FIG. 11, after being programmed during the first cycle TR101, the memory cells have a threshold voltage distribution curve as presented by a curve 1130. In addition, after the programming operation is performed for several times during the cycles, the memory cells finally have a threshold voltage distribution as presented by a curve 1140, i.e., the threshold voltage of each memory cell of the first through the fourth groups is not less than a verification voltage VF113, such that each of the first through the fourth groups is programmed to the target state. Besides, in comparison with a width (i.e., a voltage difference $\Delta V11$) of the threshold voltage distribution curve 1110, a width of the threshold voltage distribution curve 1130 is about a quarter of the width of the threshold voltage distribution curve 1130, i.e., $\frac{1}{4} \times \Delta V11$.

In other words, during the grouping period TD10, the memory controller 220 uses the first pre-programming pulse 1010 to perform the first-time grouping and programming operation, so as to divide the memory cells into two groups. In addition, during the grouping period TD10, the memory controller 220 further uses the second pre-programming pulse 1030 and the third pre-programming pulse 1040 to perform the second-time grouping and programming operation, so as to divide the memory cells into $2^2$ groups. In addition, after the first-time programming operation during the first cycle TR101, the width of the threshold voltage distribution curve 1130 of the memory cells is reduced to $1/(2^2)$ of the width of the initial threshold voltage distribution curve 1110.

To deduce by analogy, in another embodiment, the memory controller 220 may perform the grouping and programming operation for K times during the grouping period, so as to divide the memory cells into $2^K$ groups. In this way, after the first-time programming operation during the first cycle, the width of the threshold voltage distribution curve of the memory cells is reduced to $1/(2^K)$ of the width of the initial threshold voltage distribution curve, wherein K is an integer greater than or equal to 2. Thereby, the width of the threshold voltage distribution curve of the memory cells may be effectively reduced, which contributes to increasing the programming speed of the memory array 210 and preventing the occurrence of the bit-line interference effect.

In light of the foregoing, the invention utilizes the memory cell grouping procedure to divide the memory cells into a plurality of groups, and provides different programming pulses for the memory cells of different groups in the programming procedure. Thereby, the width of the threshold voltage distribution curve of the memory cells may be effectively reduced, such that cycle times of the program operation can be reduced. In this way, the verification time of the memory array can be reduced, which contributes to increasing the programming speed of the memory array. In addition, as the width of the threshold voltage distribution curve is reduced, the occurrence of the bit-line interference effect may be prevented.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A programming method of a memory device, wherein a memory array of the memory device comprises a plurality of memory cells electrically connected to a word line, and the programming method comprises:

performing a memory cell grouping procedure to divide the memory cells into a plurality of groups, wherein the groups comprise a first group and a second group, wherein the memory cell grouping procedure comprises:

providing a first pre-programming pulse to the word line, and programming the memory cells by the first pre-programming pulse;

providing a first pre-verification pulse to the word line, and determining whether the memory cells respectively pass a first pre-verification operation by the first pre-verification pulse, wherein when a threshold voltage of each of the memory cells is not less than a voltage of the first pre-verification pulse, the memory cells are determined to pass the first pre-verification operation;

selecting the memory cells which pass the first pre-verification operation from the memory cells to serve as the first group; and selecting the memory cells which do not pass the first pre-verification operation from the memory cells to serve as the second group; and performing a programming procedure after performing the memory cell grouping procedure, wherein the programming procedure comprises:

providing a first programming pulse, a second programming pulse and a verification pulse to the word line;

programming the first group by the first programming pulse, and programming the second group by the second programming pulse; and determining whether the first group and the second group respectively pass a verification operation by the verification pulse, wherein the verification voltage is greater than the first pre-verification voltage.

2. The programming method according to claim 1, wherein a threshold voltage of each of the memory cells of the first group is greater than a threshold voltage of each of the memory cells of the second group, and the first programming pulse is less than the second programming pulse.

3. The programming method according to claim 1, further comprising:

continuously repeating the programming procedure to program the first group to a target state by the first programming pulse gradually rising to a first voltage and program the second group to the target state by the second programming pulse gradually rising from a second voltage.

4. The programming method according to claim 1, wherein the groups further comprise a third group, and the memory cell grouping procedure further comprises:

providing a second pre-verification pulse to the word line, and determining whether the memory cells respectively pass a second pre-verification operation by the second pre-verification pulse, wherein the second pre-verification pulse is less than the first pre-verification pulse, and the memory cells of the second group pass the second pre-verification operation; and selecting the memory cells which do not pass the first pre-verification operation and the second pre-verification operation from the memory cells to serve as the third group.

5. The programming method according to claim 4, wherein the programming procedure further comprises:

providing a third programming pulse to the word line, wherein the third programming pulse is greater than the second programming pulse; and programming the third group by the third programming pulse, and determining whether the third group passes the verification operation by the verification pulse.

6. The programming method according to claim 5, further comprising:

continuously repeating the programming procedure to program the first group to a target state by the first programming pulse gradually rising to a first voltage, program the second group to the target state by the second programming pulse gradually rising from a second voltage to a third voltage, and program the third group to the target state by the third programming pulse gradually rising from a fourth voltage.

7. The programming method according to claim 1, wherein the groups further comprise a third group and a fourth group, and the memory cell grouping procedure comprises:

after providing the first pre-programming pulse and the first pre-verification pulse, sequentially providing a second pre-programming pulse, a third pre-programming pulse and a second pre-verification pulse to the word line, wherein the third pre-programming pulse is greater than the second pre-programming pulse, the second pre-programming pulse is greater than the first pre-programming pulse, and the second pre-verification pulse is greater than the first pre-verification pulse;

programming the memory cells passing the first pre-verification operation by the second pre-programming pulse, and programming the memory cells not passing the first pre-verification operation by the third pre-programming pulse;

determining whether the memory cells respectively pass a second pre-verification operation by the second pre-verification pulse, wherein the memory cells of the first and the second groups further pass the second pre-verification operation;

selecting the memory cells which pass the first pre-verification operation, but do not pass the second pre-verification operation from the memory cells to serve as the third group; and selecting the memory cells which do not pass the first pre-verification operation and the second pre-verification operation from the memory cells to serve as the fourth group.

8. The programming method according to claim 7, wherein the programming procedure further comprises:

providing a third programming pulse to the word line, and programming the memory cells of the third group by the third programming pulse, wherein the third programming pulse is greater than the first programming pulse, and the third programming pulse is less than the second programming pulse;

providing a fourth programming pulse to the word line, and programming the memory cells of the fourth group by the fourth programming pulse, wherein the fourth programming pulse is greater than the second programming pulse; and determining whether the third group and the fourth group respectively pass the verification operation by the verification pulse.

9. The programming method according to claim 1, wherein the memory array is a NAND memory array.

10. A memory device, comprising:

a memory array, comprising a plurality of memory cells, and the memory cells being electrically connected to a word line; and a memory controller, performing a memory cell grouping procedure to divide the memory cells into a plurality of groups, wherein the groups comprise a first group and a second group, wherein the memory controller performs a programming procedure after performing the memory cell grouping procedure and in the programming procedure, the memory controller is configured to:

provide a first programming pulse, a second programming pulse and a verification pulse to the word line;

program the first group by the first programming pulse, and program the second group by the second programming pulse; and determine whether the first group and the second group respectively pass a verification operation by the verification pulse, so as to determine whether to repeat the programming procedure, wherein the memory controller in the memory cell grouping procedure is further configured to:

provide a first pre-programming pulse to the word line and program the memory cells by the first pre-programming pulse;

provide a first pre-verification pulse to the word line and determine whether the memory cells respectively pass a first pre-verification operation by the first pre-verification pulse, wherein when a threshold voltage of each of the memory cells is not less than a voltage of the first pre-verification pulse, the memory cells are determined to pass the first pre-verification operation; and select the memory cells which pass the first pre-verification operation from the memory cells to serve as the first group, and select the memory cells which do not pass the first pre-verification operation from the memory cells to serve as the second group, wherein the verification voltage is greater than the first pre-verification voltage.

11. The memory device according to claim 10, wherein a threshold voltage of each of the memory cells of the first group is greater than a threshold voltage of each of the memory cells of the second group, and the first programming pulse is less than the second programming pulse.

12. The memory device according to claim 10, wherein the memory controller continuously repeats the programming procedure to program the first group to a target state by the first programming pulse gradually rising to a first voltage, and program the second group to the target state by the second programming pulse gradually rising from a second voltage.

13. The memory device according to claim 10, wherein the groups further comprise a third group, and in the programming procedure, the memory controller is further configured to:

provide a second pre-verification pulse to the word line, and determine whether the memory cells respectively pass a second pre-verification operation by the second pre-verification pulse, wherein the second pre-verification pulse is less than the first pre-verification pulse, and the memory cells of the second group pass the second pre-verification operation; and select the memory cells which do not pass the first pre-verification operation and the second pre-verification operation from the memory cells to serve as the third group.

14. The memory device according to claim 13, and in the programming procedure, the memory controller is further configured to:

provide a third programming pulse to the word line, wherein the third programming pulse is greater than the second programming pulse; and program the third group by the third programming pulse, and determine whether the third group passes the verification operation by the verification pulse.

15. The memory device according to claim 14, wherein the memory controller is further configured to continuously repeat the programming procedure to program the first group to a target state by the first programming pulse gradually rising to a first voltage, program the second group to the target state by the second programming pulse gradually rising from a second voltage to a third voltage, and program the third group to the target state by the third programming pulse gradually rising from a fourth voltage.

16. The memory device according to claim 10, wherein the groups further comprise a third group and a fourth group, and in the programming procedure, the memory controller is further configured to:

sequentially provide a second pre-programming pulse, a third pre-programming pulse and a second pre-verification pulse to the word line after the first pre-programming pulse and the first pre-verification pulse are provided, wherein the third pre-programming pulse is greater than the second pre-programming pulse, the second pre-programming pulse is greater than the first pre-programming pulse, and the second pre-verification pulse is greater than the first pre-verification pulse;

program the memory cells passing the first pre-verification operation by the second pre-programming pulse and program the memory cells not passing the first pre-verification operation by the third pre-programming pulse;

determine whether the memory cells respectively pass a second pre-verification operation by the second pre-verification pulse, wherein the memory cells of the first and the second groups further pass the second pre-verification operation;

select the memory cells which pass the first pre-verification operation, but do not pass the second pre-verification operation from the memory cells to serve as the third group; and select the memory cells which do not pass the first pre-verification operation and the second pre-verification operation from the memory cells to serve as the fourth group.

17. The memory device according to claim 16, wherein in the programming procedure, the memory controller is further configured to:

provide a third programming pulse to the word line, and program the memory cells of the third group by the third programming pulse, wherein the third programming pulse is greater than the first programming pulse, and the third programming pulse is less than the second programming pulse;

provide a fourth programming pulse to the word line, and program the memory cells of the fourth group by the fourth programming pulse, wherein the fourth programming pulse is greater than the second programming pulse; and determine whether the third group and the fourth group respectively pass the verification operation by the verification pulse.

18. The memory device according to claim 10, wherein the memory array is a NAND memory array.

* * * * *